April 3, 1956

W. D. CANNON 2,740,849

DIRECT COUPLED AMPLIFIER CIRCUIT

Filed Nov. 29, 1950

INVENTOR
W. D. CANNON

BY M. J. Reynolds
ATTORNEY

United States Patent Office 2,740,849 Patented Apr. 3, 1956

2,740,849

DIRECT COUPLED AMPLIFIER CIRCUIT

William D. Cannon, Metuchen, N. J., assignor to The Western Union Telegraph Company, New York, N. Y., a corporation of New York Application November 29, 1950, Serial No. 198,110

10 Claims. (Cl. 179—171)

This invention relates to improvements in amplifying circuits embodying direct coupled output stages, and more particularly to such amplifying circuits in which the output stages thereof are adapted to handle very low frequencies and in which the available plate power supply is limited.

In the use of an amplifier in which frequency linearity down to very low values is required, it is not practicable to employ transformer or inductance-capacitance coupling of the output stage to the load device and in consequence it is common to employ resistance-coupling instead. In such cases, however, a considerable amount of the power generated is dissipated in the coupling resistors.

An object of the present invention is to provide suitable means for substantially increasing the power output in a direct coupled amplifier output stage, without increasing the demand upon the plate power supply.

Another object is to substantially increase the coupling efficiency of the power output stage of a linear amplifier.

A further object is to secure the highest possible output power within the limits of a fixed plate potential of a signal amplifier, particularly where the signal frequencies are low.

Other objects and advantages will be apparent from the following description of a circuit arrangement embodying the invention, taken in connection with the accompanying drawings, in which.

Figure 1:
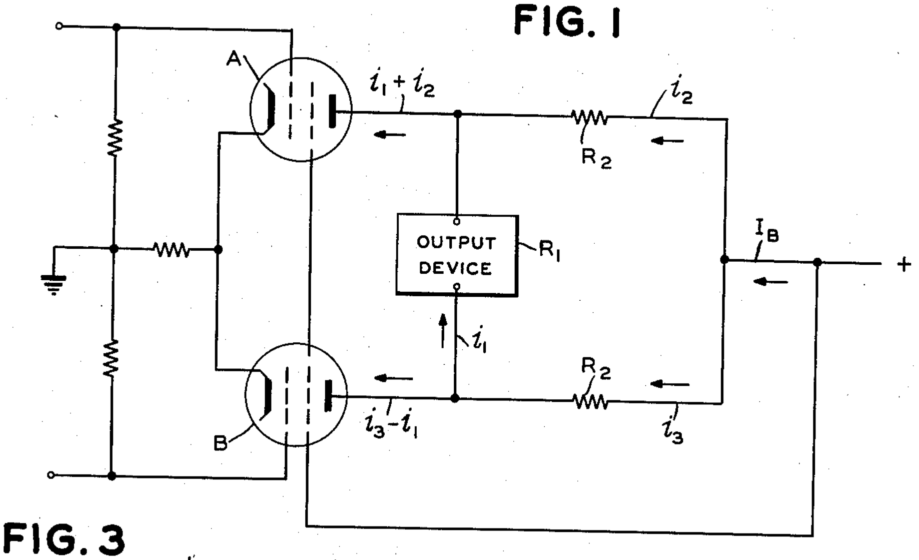
Fig. 1 shows a linear amplifier having a balanced output stage conductively coupled to a load device by means of coupling resistors, and in which a considerable amount of power is dissipated in the coupling resistors.

Referring to Fig. 1, identical tubes A and B represent a balanced output stage conductively coupled to a load device $R_1$ by means of two identical coupling resistors $R_2$. The coupling efficiency for such a stage can be computed as follows: Neglecting for the moment the presence of the load device $R_1$, the current $I_B$ flowing at any instant from the plate battery of $E_B$ volts divides between the two resistors $R_2$ and the tubes A and B according to the relative impedances of the two tubes as determined by their respective grid potentials. However, when the load device $R_1$ is connected as shown, some of the current $I_B$ will flow therethrough in the direction of the tube which at that instant has the lowest impedance, and this alone constitutes the useful load current. For this latter condition let the various currents be represented by the symbols of Fig. 1 and bear the sense indicated by the arrows. If $i_d$ represents the difference between the space currents of the two tubes, then $$i_d = i_2 + i_1 - (i_3 - i_1) = 2i_1 + i_2 - i_3$$

and the proportion of total tube current to useful load current is then:

$$\frac{i_1}{i_d} = \frac{1}{2 + \frac{i_2 - i_3}{i_1}} \quad (1)$$

Equating to zero the potential drops around the loop $R_1$, $R_2$, $R_2$.

$$i_1R_1 = i_2R_2 + i_3R_2 = 0$$

whence $$\frac{i_2 - i_3}{i_1} = \frac{R_1}{R_2}$$

and substituting this in (1) above gives $$\frac{i_1}{i_d} = \frac{1}{2 + \frac{R_1}{R_2}} \quad (2)$$

Typical parameters for a tube such as the 7A5 when used in the circuit of Fig. 1 in connection with a recording device are, $R_1 = 3000$ ohms, $R_2 = 4000$ ohms, $E_B = 380$ volts and quiescent value of current in each of the tubes $A$ and $B = 45$ mils. Then $$\frac{i_1}{i_d} = \frac{1}{2 + \frac{3000}{4000}} = 0.364$$

If it be assumed that the maximum difference in current $i_d$ between the two tubes is 80 mils (5 mils in one tube, 85 mils in the other tube) for operation within permissible distortion limits, then the maximum useful load current will be $$i_1 = .364 \times 80 = 29.1 \text{ mils}$$

and the ratio of useful power to total power supplied, in watts, is $$\frac{(.0291)^2 \times 3000}{.09 \times 380} = \frac{2.54}{34.20} = 7.4\%$$

a very low efficiency.

It would be possible to increase the useful power from the above circuit somewhat by adding a like tube in parallel with both tubes A and B and altering the circuit values so that the conditions now would be: $R_2 = 2000$ ohms and $I_B = 160$ mils to give $$\frac{i_1}{i_d} = .285$$

with $i_1 = .285 \times 160 = 45.7$ mils. The efficiency in this case would be $$\frac{(.0457)^2 \times 3000}{.180 \times 380} = \frac{6.3}{68.4} = 9.2\%$$

which at most is only a modest improvement.

Figures 2, 3:
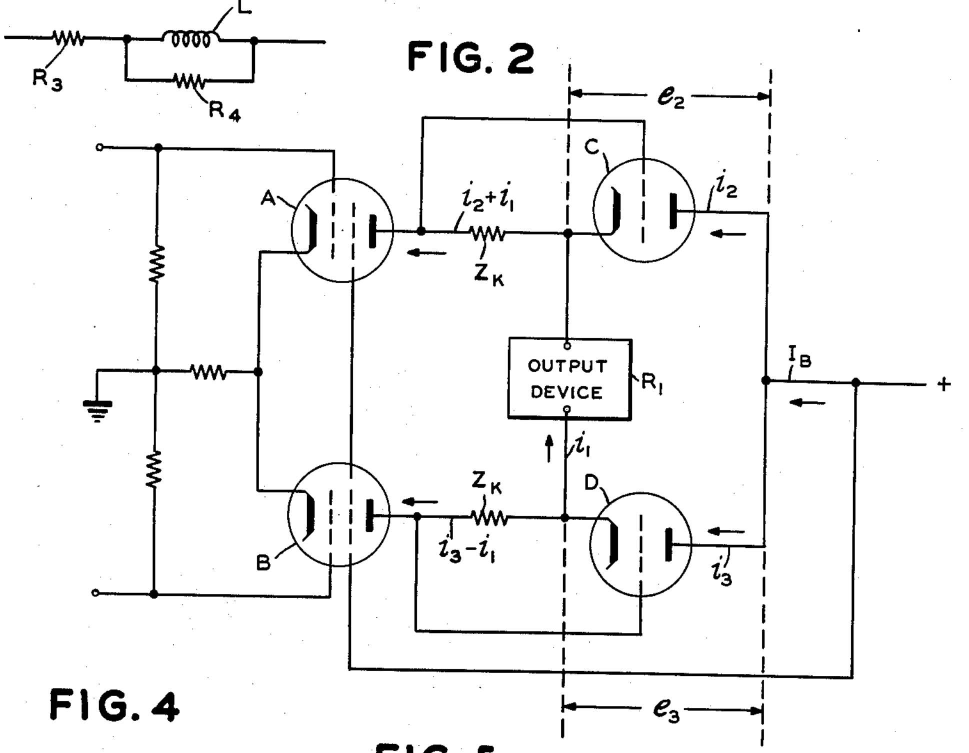
Fig. 2 shows a linear amplifier having a balanced output stage conductively coupled to a load device, and in which the coupling loss is substantially reduced in accordance with the principles of the instant invention.
Fig. 3 shows a network for conductively coupling the output stage to the load device in the arrangement of Fig. 2.

With respect to the power dissipated in the output stage, most of this is lost in coupling resistors $R_2$, and efforts to improve efficiency can most profitably be directed toward reduction of this loss. In accordance with the instant invention, and as illustrated in Fig. 2, the reduction of the coupling loss is obtained by employing a second pair of vacuum tubes C and D instead of the resistors $R_2$ of the arrangement of Fig. 1, which vacuum tubes are so connected as to employ cathode drive. In Fig. 2 the tubes A and B remain as before, and relatively small impedances $Z_K$ are added in series with their anodes for the purpose of deriving energizing potentials for the grids of tubes C and D. These grids are driven in opposite sense from the grids of the first pair of tubes so that the circuit is now in effect a double acting bridge operating to apply greatly increased power to the load device. The extent of this power increase may be determined as follows.

Adopting the nomenclature of Fig. 2, the ratio of useful power to total power is, as before $$\frac{i_1}{i_d}=\frac{1}{2+\frac{i_2-i_3}{i_1}} \qquad (1)$$

and the potential drops around the corresponding loop are $$i_1R_1-e_2+e_3=0$$

or $$\qquad (3)$$

$$i_1R_1=e_2-e_3$$

It is well known that the family of curves which represent the characteristics of a three element vacuum tube may be approximately expressed by the equation:

$$e_p=R_pi_p-\mu e_g$$

where $e_p$=Plate voltage
$R_p$=Resistance of the plate-cathode path
$i_p$=Plate current
$\mu$=Amplification constant
$e_g$=Grid voltage For tube C, $$e_g=-(i_2+i_1)Z_K$$

therefore $$e_2=R_pi_2+\mu(i_2+i_1)Z_K \qquad (4)$$
$$=i_2(R_p+\mu Z_K)+i_1\mu Z_K$$

and for tube D $$e_g=-(i_3-i_1)Z_K$$

therefore $$e_3=R_pi_3+\mu(i_3-i_1)Z_K \qquad (5)$$
$$=i_3(R_p+\mu Z_K)-i_1\mu Z_K$$

Substituting (4) and (5) in (3)

$$i_1R_1=(i_2-i_3)(R_p+\mu Z_K)+2i_1\mu Z_K$$

or $$\frac{i_2-i_3}{i_1}=\frac{R_1-2\mu Z_K}{R_p+\mu Z_K}$$

whence $$\frac{i_1}{i_d}=\frac{1}{2+\frac{R_1-2\mu Z_K}{R_p+\mu Z_K}} \qquad (6)$$

If tubes such as the 6V6 connected as triodes are used as coupling tubes C and D, the constants would be approximately $R_p$=2500 ohms, $\mu$=9 and $Z_K$=to a resistance of 250 ohms. Then $$\frac{i_1}{i_d}=\frac{1}{2+\frac{3000-4500}{2500+2250}}=.594$$

for the same current in tubes A and B as in Fig. 1. The load current now is $i_1$=.594×80=47.6 mils, and the efficiency is $$\frac{(.0476)^2\times 3000}{.09\times 380}=\frac{6.8}{34.0}=20\%$$

Hence the power output has been increased by a factor of 2.67 without any increase in power from the plate battery supply.

Experimentally the improvement in efficiency is somewhat more than the foregoing theoretical figures indicate, the improvement factor being about 2.9 instead of 2.67.

Complete figures for power consumption would, of course, also include heater current consumption. However, the circuit of Fig. 2 involving only the addition of two tubes permits almost a three-fold increase in output power without increasing the demands upon the plate battery supply.

The circuit of Fig. 2 is essentially simple and its operation stable. As is common in multiple tube power output stages, RF chokes may be desirable in series with the grids of tubes C and D for the purpose of preventing high frequency oscillation. As shown, tubes A and B are pentode connected but this is not essential. Tubes C and D are preferably triode connected because, since the cathodes are not at a fixed potential, it is inconvenient to provide a suitable positive potential supply for the screen grids. These tubes should have a relatively large transconductance so that small grid exciting potentials will suffice and the resistive component of impedance $Z_K$ will be maintained at a small value.

The circuit is particularly applicable to cases where it is desired to secure the highest possible output power within the limits of a fixed plate potential, especially where the signal frequencies are low.

It is to be understood that the specific tubes and circuit constants given in the foregoing example were employed solely for the purpose of illustration and that many other tubes and values of circuit constants might be employed in a circuit arrangement in accordance with the invention.

In the equation:

$$\frac{i_1}{i_d}=\frac{1}{2+\frac{R_1-2\mu Z_K}{R_p+\mu Z_K}} \qquad (6)$$

$Z_K$ represents a generalized impedance which may comprise various combinations of resistors, inductors and capacitors. For linear amplification, the impedance $Z_K$, throughout the useful working range of frequencies, should be limited to a value at which the grid swing of tubes C and D does not extend appreciably beyond the linear range. More specifically, the resistive component of the impedance $Z_K$ should lie within the range of approximately 40% to 60% of the dynamic impedance value of the associated coupling tube for coupling tubes having relatively low dynamic impedance values in the order of 750 ohms and within the range of 5% to 20% of the dynamic impedance of the associated coupling tube for coupling tubes having relatively high dynamic impedance values in the order of 2500 ohms. An example of a tube having a dynamic impedance in the order of 750 ohms is the 2A3. An example of a tube having a dynamic impedance in the order of 2500 ohms is a triode connected 6V6.

The resistive component of impedance $Z_K$ may also be defined in terms of the static and dynamic coupling tube impedances. The tube equation:

$$e_p=R_pi_p-\mu e_g$$

may be written:

$$\frac{e_p}{i_p}-R_p=-\frac{\mu e_g}{i_p}$$

The left hand side of this equation is in the form of an impedance while the right hand side defines the operating parameters of the tube. These operating parameters are, according to the equation, equal to the difference between the static tube impedance $e_p/i_p$ and the dynamic impedance $R_p$. The resistive component of impedance $Z_K$ should be chosen so as to lie within the range of approximately 10% to 25% of the difference between the coupling tube static impedance and dynamic impedance.

The impedance $Z_K$ of Fig. 2 may be realized in the form of a resistance element or as an impedance network.

Use of an impedance network permits increased power output at any desired signal frequency above zero frequency and adjustment of the amplifier frequency response. One suitable network is illustrated in Fig. 3 and comprises a parallel combination of a resistor $R_4$ and an inductance element L, the parallel combination being in series with a resistor $R_3$.

If the network shown in Fig. 3 were used for the impedance $Z_K$ of Fig. 2, the impedance of the network would be:

$$Z_K = R_3 + \frac{j\omega L R_4}{R_4 + j\omega L} \quad (7)$$

where $\omega$ represents $2\pi$ times the frequency of the signal to be amplified. The value of impedance $Z_K$ may be expressed in terms of relative frequencies by letting $R_4 = \omega_0 L$. The impedance $Z_K$ is now given by the expression:

$$Z_K = R_3 + \frac{j\frac{\omega}{\omega_0}}{1 + j\frac{\omega}{\omega_0}} R_4 \quad (8)$$

The efficiency of the circuit in Fig. 2 using the network of Fig. 3 can be calculated by substituting the value of $Z_K$ from Equation 8 into Equation 6. By performing this calculation for various values of $\omega/\omega_0$ it is found that the efficiency increases at the higher relative frequencies $\omega/\omega_0$.

Figure 4:
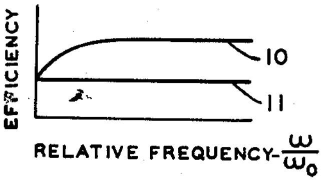
Fig. 4 shows curves of efficiency versus relative frequency in the circuit of Fig. 2 using a coupling network as shown in Fig. 3 and using a resistance.

This increase in efficiency is illustrated in Fig. 4 which shows curves of efficiency versus relative frequency for the circuit of Fig. 2. Curve 10 of Fig. 4 shows the variations in efficiency where $Z_K$ is realized as an impedance network of the type shown in Fig. 3. Curve 11 shows the efficiency where $Z_K$ is realized as a resistive element. From curve 10 it can be seen that the efficiency, when using the network of Fig. 3, increases at higher values of frequency.

Figure 5:
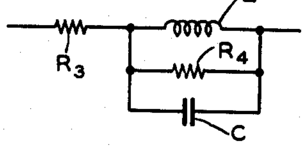
Fig. 5 shows another network for conductively coupling the output stage to the load device in the arrangement of Fig. 2.

Fig. 5 shows another network suitable for use as impedance $Z_K$. The network of Fig. 5 is similar to that of Fig. 3 but differs therefrom in the addition of a capacitive element C in parallel with the parallel combination of resistor $R_4$ and inductance element L. Various networks may be used for impedance $Z_K$ in order to secure different frequency responsive curves.

While the invention has been described in a particular use thereof and in particular embodiments, it is not desired that it be limited thereto for obvious modifications thereof will occur to those skilled in the art without departing from the spirit and scope of the invention as set forth in the appended claims.

What is claimed is:

1. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of constant impedance elements each connected between the cathode of a said coupling tube and the anode of the corresponding push-pull thermionic tube and having a resistive component between 5 and 20 percent of the dynamic impedance of the said coupling tube in the case of a coupling tube having relatively high dynamic impedance in the neighborhood of 2500 ohms and between 40 and 60 percent thereof in the case of relatively low dynamic impedance in the neighborhood of 750 ohms, whereby the power output of the amplifier is substantially increased without substantially increasing the demand on the anode power supply.

2. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of constant impedance elements each connected between the cathode of a said coupling tube and the anode of the corresponding push-pull thermionic tube and having a resistive component between 5 and 20 percent of the dynamic impedance of the said coupling tube in the case of a coupling tube having a value of dynamic impedance of the order of 2500 ohms and between 40 and 60 percent thereof in the case of a coupling tube having a value of dynamic impedance of the order of 750 ohms, whereby the power output of the amplifier is substantially increased without substantially increasing the demand on the anode power supply.

3. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of constant impedance elements each connected between the cathode of a said coupling tube and the anode of the corresponding push-pull thermionic tube and having a resistive component between 5 and 20 percent of the dynamic impedance of the said coupling tube in the case of a coupling tube having a value of dynamic impedance of the order of 2500 ohms, whereby the power output of the amplifier is substantially increased without substantially increasing the demand on the anode power supply.

4. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of constant impedance elements each connected between the cathode of a said coupling tube and the anode of the corresponding push-pull thermionic tube and having a resistive component between 40 and 60 percent of the dynamic impedance of the said coupling tube, in the case of a coupling tube having a value of dynamic impedance of the order of 750 ohms, whereby the power output of the amplifier is substantially increased without substantially increasing the demand on the anode power supply.

5. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of resistive elements each connected between the cathode of said coupling tube and the anode of the corresponding push-pull thermionic tube and having a value between 5 and 50 percent of the dynamic impedance of the said coupling tube in the case of a coupling tube having a value of dynamic impedance of the order of 2500 ohms and between 40 and 60 percent thereof in the case of a coupling tube having a value of dynamic impedance of the order of 750 ohms, whereby the power output of the amplifier is substantially increased without substantially increasing the demand on the anode power supply.

6. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of passive impedance networks each connected between the cathode of said coupling tube and the anode of the corresponding push-pull thermionic tube and having a resistive component thereof of a value between 5 and 20 percent of the dynamic impedance of the said coupling tube in the case of a coupling tube having a value of dynamic impedance of the order of 2500 ohms and between 40 and 60 percent thereof in the case of a coupling tube having a value of dynamic impedance of the order of 750 ohms, whereby the power output of the amplifier is substantially increased without substantially increasing the demand on the anode power supply.

7. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of passive impedance networks each consisting of a first resistive element, a second resistive element serially connected thereto and an inductive element connected in parallel with the second resistive element, each of said impedance networks being connected between a cathode of a said coupling tube and an anode of a corresponding said push-pull thermionic tube and having a value between 5 and 20 percent of the dynamic impedance of the said coupling tube in the case of a coupling tube having a value of dynamic impedance of the order of 2500 ohms and between 40 and 60 percent thereof in the case of a coupling tube having a value of dynamic impedance of the order of 750 ohms, whereby the power output of the amplifier is substantially increased without substantially increasing the demand on the anode power supply.

8. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of passive impedance networks each consisting of a first resistive element, a second resistive element serially connected thereto, an inductive element connected in parallel with the said second resistive element, and a condenser connected in parallel with said second resistive element, each of said impedance networks being connected between a cathode of a said coupling tube and an anode of a corresponding said push-pull thermionic tube and having a value between 5 and 20 percent of the dynamic impedance of the said coupling tube in the case of a coupling tube having a value of dynamic impedance of the order of 2500 ohms and between 40 and 60 percent thereof in the case of a coupling tube having a value of dynamic impedance of the order of 750 ohms, whereby the power output of the amplifier is substantially increased without substantially increasing the demand on the anode power supply.

9. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of resistive elements each connected between the cathode of a said compiling tube and the anode of the corresponding push-pull thermionic tube and having a resistive component between 5 and 20 percent of the dynamic impedance of the said coupling tube in the case of a coupling tube having relatively high dynamic impedance in the neighborhood of 2500 ohms and between 40 and 60 percent thereof in the case of relatively low dynamic impedance in the neighborhood of 750 ohms, whereby the power output of the amplifier is substantially increased without substantially increasing the demand on the anode power supply.

10. A direct coupled power amplifier for supplying a load device, the said amplifier including a balanced output stage comprising a pair of push-pull thermionic tubes having cathodes connected to each other and coupled to a common ground and each a grid connected to a source of signals, a screen element connected to a common source of positive potential and an anode connection, means connected to the said grids to provide grid return thereto, a corresponding pair of coupling tubes having cathodes, and having grids connected to the corresponding aforesaid anode connections, and having anodes connected to a common source of positive potential, an output device interconnecting the cathodes of said coupling tubes, and a corresponding pair of impedance networks each connected between the cathode of a said coupling tube and the anode of the corresponding push-pull thermionic tube and having a resistive component between 5 and 20 percent of the dynamic impedance of the said coupling tube in the case of a coupling tube having relatively high dynamic impedance in the neighborhood of 2500 ohms and between 40 and 60 percent thereof in the case of relatively low dynamic impedance in the neighborhood of 750 ohms, whereby the power output of the amplifier is substantially increased without substantially increasing the demand on the anode power supply.

References Cited in the file of this patent

UNITED STATES PATENTS

| | | |
|---|---|---|
| 2,424,893 | Mansford | July 29, 1947 |
| 2,529,459 | Pourciau et al. | Nov. 7, 1950 |
| 2,543,819 | Williams | Mar. 6, 1951 |
| 2,545,507 | Williams | Mar. 20, 1951 |
| 2,561,425 | Stachura | July 24, 1951 |
| 2,631,198 | Parisoe | Mar. 10, 1953 |

OTHER REFERENCES

Article by Artzt, "Survey of D. C. Amplifiers," Electronics, August 1945, pp. 2 through 8.